United States Patent [19]
Lee et al.

[11] Patent Number: 5,204,839
[45] Date of Patent: Apr. 20, 1993

[54] PROGRAM OPTIMIZING CIRCUIT AND METHOD FOR AN ELECTRICALLY ERASABLE AND PROGRAMMABLE SEMICONDUCTOR MEMORY DEVICE

[75] Inventors: Woong-Mu Lee; Jin-Ki Kim, both of Seoul, Rep. of Korea

[73] Assignee: Samsung Electronics Co., Ltd., Suwon, Rep. of Korea

[21] Appl. No.: 681,716

[22] Filed: Apr. 8, 1991

[30] Foreign Application Priority Data

Sep. 19, 1990 [KR] Rep. of Korea ................ 1990-14829

[51] Int. Cl.$^5$ .............................................. G11C 7/00
[52] U.S. Cl. ..................................... 365/204; 365/96
[58] Field of Search ............ 365/96, 185, 204, 230.06, 365/218, 189.01

[56] References Cited
U.S. PATENT DOCUMENTS

4,423,492 12/1983 Yoshida .............................. 365/185
4,918,663 4/1990 Remington ..................... 365/189.06
5,103,425 4/1992 Kuo ....................................... 365/96

Primary Examiner—Eugene R. LaRoche
Assistant Examiner—A. Zarabian
Attorney, Agent, or Firm—Robert E. Bushnell

[57] ABSTRACT

A program optimizing circuit for an EEPROM array comprising a program voltage generating circuit connected to each of bit lines, an anti-program voltage generating circuit connected between input/output data line and data input/output buffer and circuit for causing column decoder to selectively produce anti-program voltage or column address, is disclosed. The program voltage generating circuit further includes a first high voltage pumping circuit, transfer means and latch circuit. The operation of the first high voltage pumping circuit is controlled by the data stored in the latch circuit. In programming, the anti-program voltage is applied to all the bit lines, so as to prevent the unwanted memory cells from being programmed or erased.

34 Claims, 7 Drawing Sheets

PROGRAM OPTIMIZING CIRCUIT AND METHOD FOR AN ELECTRICALLY ERASABLE AND PROGRAMMABLE SEMICONDUCTOR MEMORY DEVICE

BACKGROUND OF THE INVENTION

The present invention relates to an electrically erasable and programmable read-only memory (EEPROM), and more particularly to a program (write) optimizing circuit and method for EEPROM.

A recent EEPROM consists of as a memory cell a floating gate field effect transistor doubly deposited gates, of which one is a control gate for receiving an external voltage, and the other is a floating gate formed with insulation between the control gate and the channel region, so that a high voltage of a given level may be applied to a selected word line of the memory cell so as to make the floating gate into an enhancement type for erasing, while to make the transistor of the memory cell into a depletion type for program.

Generally, the program is performed in pages in order to reduce the write time. The page is referred to as all the memory cells connected to a word line that are in a row. Hence, if a word line is selected by a row decoder, a high voltage of a given level is applied to the drains of the memory cells whose control gates are connected to the selected row, so that a program is made.

However, in an EEPROM employing a NAND type memory cell array in which a plurality of memory cells constitute the unit of a memory string through a common string select transistor and ground select transistor, the channels of the memory cells are connected in series between the string select transistor and ground select transistor, so that when the word line selected for programming a memory cell of the memory string is grounded and a high voltage is applied to the bit line, the memory cells connected to the word lines not selected must be prevented from being undesirably programmed by the high voltage. Hence, there has been disclosed a method for applying a voltage of a given level to the word lines and bit lines of the memory cell not selected in order to prevent the undesired program.

Most recently, there has been disclosed an article entitled as "A 5V-Only One-transistor 256K EEPROM with Page-Mode Erase" written by Takeshi Nakayama, et al. in Pages 911-915, IEEE Journal of Solid—State Circuits, August 1989. The circuit and the operation timing diagram thereof concerning program and anti-program disclosed in the article are depicted in FIGS. 1 and 2.

Referring to FIG. 1, a pump circuit 20 for programming and a pump circuit 30 for anti-programming are connected to each bit line BL of EEPROM memory cell 50. A discharge transistor 25, whose gate is connected to a control signal BLR, makes the bit line be connected to a ground voltage terminal while erasing. The program pump circuit 20 is a charge pump comprising two NMOS transistors 24, 26 and a capacitor 27. The pumping clock $\phi$ applied to the capacitor 27 is delivered or blocked to the program pump circuit 20 through an NMOS transistor 22. The gate of the gating NMOS transistor 22 is connected to the output of a latch circuit 60. The latch circuit 60 stores the data received before programming of the memory cell, thus applying or blocking a high program voltage VBPP to the corresponding bit line according to the state of the data.

Namely, since the output of the latch circuit 60 is connected to the gate of the gating NMOS transistor 22, if the stored data is "0", the pumping clock $\phi$ is not applied to the program pump circuit 20 for the bit line voltage not to be raised, while if the data is "1", the pumping clock $\phi$ is applied to the capacitor 27 for the bit line to receive a program voltage of high level VBPP. The data is transmitted to the latch circuit 60 through a transfer transistor 23 with the channel connected between the bit line and the input (or output) of the latch circuit and with the gate connected to a data transfer signal PLW.

On the other hand, the gate of a voltage transfer transistor 21 whose channel is connected between the bit line and anti-program voltage VBPI is connected to a program signal PGM and the anti-program pump circuit 30. The anti-program pump circuit 30 is a charge pump comprising two NMOS transistors 31 32 and a capacitor 33 as similarly as the program pump circuit 20, and produces the anti-program voltage VBPI on one third level of the voltage (about 15 V) used for practical programming when the program pump circuit 20 does not provide the program voltage VBPP to the corresponding bit line according to the data of the latch circuit 60 being "0". Namely, the anti-program pump circuit 30 is to prevent programming to the bit lines of the memory cell not selected.

Here, the program pump circuit 20, anti-program pump circuit 30, latch circuit 60, gating transistor 22, voltage transfer transistor 21, transfer transistor 23 and discharge transistor 25 are the circuit elements connected to a single bit line, which are provided for each bit line of a memory array with a plurality of bit lines.

In addition, a word line pump circuit 40 is connected between the word line WL of the memory cell 10 and a row decoder 50 for providing an erasing voltage (about 15 V) of high level to the word line selected while erasing. The word line pump circuit 40 is a kind of charge pump comprising two NMOS transistors 41, 42 and a capacitor 43, and generates the word line voltage VWPP about 15 V to the word line selected by the row decoder 50 while erasing, and generates the word line voltage VWPP on two thirds level of 15 V if the word line is not selected.

Between the common source line 11 of the memory cell 10 and the ground voltage terminal is connected a ground connecting transistor 12 to ground the source of the memory cell when erasing and programming. The control signal CLE applied to the gate of the ground connecting transistor 12 is also applied to the latch circuit 60, and becomes high to only enable the latch circuit 60 during the data being transmitted, erased and programmed, but data being read, makes the common source line of the memory cell be connected to the ground voltage terminal through the ground connecting transistor 12. A column select transistor 14 serves to connect the bit line to an input/output data line 15 by a Y gating signal 13 appeared from the column decoder.

Hereinafter will be described the erasing and programming functions of the structure of FIG. 1 with reference to the timing diagram of FIG. 2.

Referring to FIG. 2, if the control signal (a) to control the latch circuit 60 and the ground connecting transistor 12 becomes "high" state, data transfer signal (b) becomes "high" state for a short time, at this time, a data given from the data input/output line 15 is stored in the latch circuit 60. Then, during the erasing time (TER), the control signal (c) applied to the gate of the discharge transistor 25 maintains "high" state, making the bit line into the ground level, and the word line pump circuit 40 pumps the word line voltage (e) about 15 V as the pumping voltage VPP to the word line selected in order to erase the data of the selected memory cell.

Thereafter, if the internal timer steps into the programming time TPG, the program signal (d) is enabled as "high" state. At this time, if the information stored in the latch circuit 60 is "1" state, the program pump circuit 20 of FIG. 1 works to raise the program voltage (f) to the pumping voltage VPP, which is applied to the corresponding bit line so as to store the data "1" in the selected memory cell. Conversely, if the data stored in the latch circuit 60 is "0" state, the gating transistor 22 is turned off, so that the program pump circuit 20 cannot perform the pumping function. Instead, the program signal (d) of "high" state causes the anti-program pump circuit 30 to pump the anti-program voltage (g) of one third of the VPP level to the bit line. On the other hand, the word line selected by the row decoder 50 becomes the ground level, while to the word line not selected is applied the word line voltage (e) of two thirds of the VPP level. Reading of the cell erased or programmed is made possible by detecting the current flowing through the memory cell when the source voltage 5 V is applied to the word line, a voltage of about 2 V is applied to the bit line and the source is grounded.

Although the above conventional circuit works to maintain a suitable program state, each bit line of the memory array should include a program pump circuit 20, anti-program pump circuit 30 and latch circuit 60 as shown in FIG. 1, so that the area of the memory chip is considerably increased so as to impede high integration of the memory, and there are caused the problems in connection with the yield rate and production cost.

SUMMARY OF THE INVENTION

It is an object of the present invention to provide a program optimizing circuit for an EEPROM that is suitable for high integration by using a minimum number of constituent elements.

It is another object of the present invention to provide a method of maintaining the optimum program state of an EEPROM by using a minimum number of the constituent elements.

According to the present invention, there is provided a circuit comprising, a program voltage generating means comprising a latch circuit and a first high voltage pumping circuit and a transfer means connected to each bit line of the EEPROM array, an anti-program voltage generating means connected between an input/output data line and a data input/output buffer, a means provided in a column decoder for selectively outputting the anti-program voltage or a column address, wherein the first high voltage pumping circuit of said program voltage generating means comprising a capacitor having an electrode for receiving pumping clock pulses, a first insulating gate transistor with the drain and gate connected to the other electrode of said capacitor, a node connected to the source of said first insulating gate transistor, a second insulating gate transistor with the gate, source and drain respectively connected to said node, the gate of said first insulating gate transistor and a first high voltage, a third insulating gate transistor with the gate, drain and source respectively connected to said node, said high voltage and one of said bit lines, a fourth insulating gate transistor with the drain, gate and source respectively connected to said node, voltage source and the output of said latch circuit, and wherein said transfer means comprising a channel connected between the output of said latch circuit and a bit line and a gate connected to a bit line select signal.

According to one aspect of the present invention, the anti-program voltage is applied to the gate of column select resistor and transferred to the bit line through a column select transistor during programming.

The present invention will now be described more specifically with reference to the drawings attached only by way of example.

BRIEF DESCRIPTION OF THE ATTACHED DRAWINGS

DETAILED DESCRIPTION OF A PREFERRED EMBODIMENT

Figure 1:
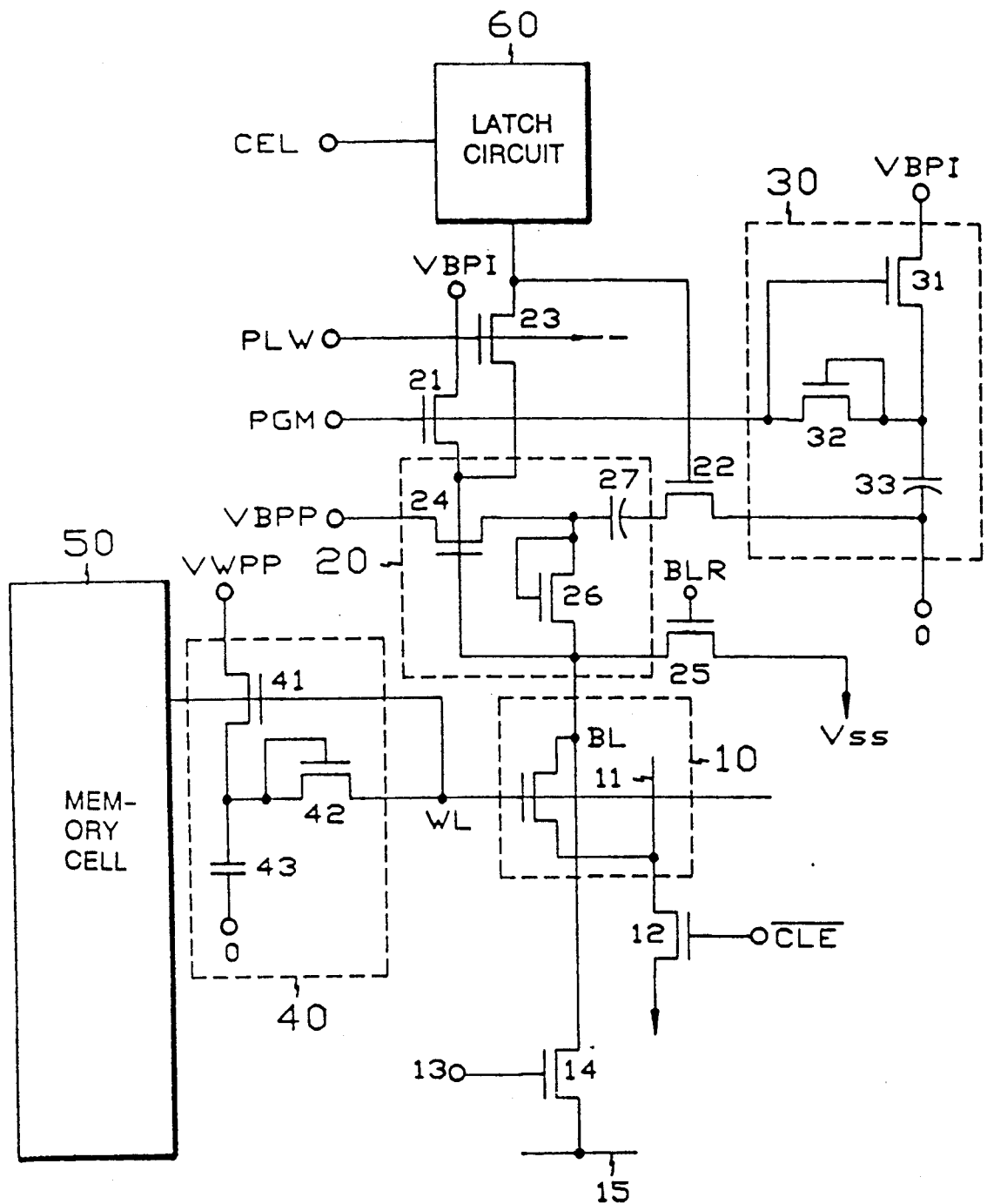
FIG. 1 is a conventional circuit diagram.
Figure 2:
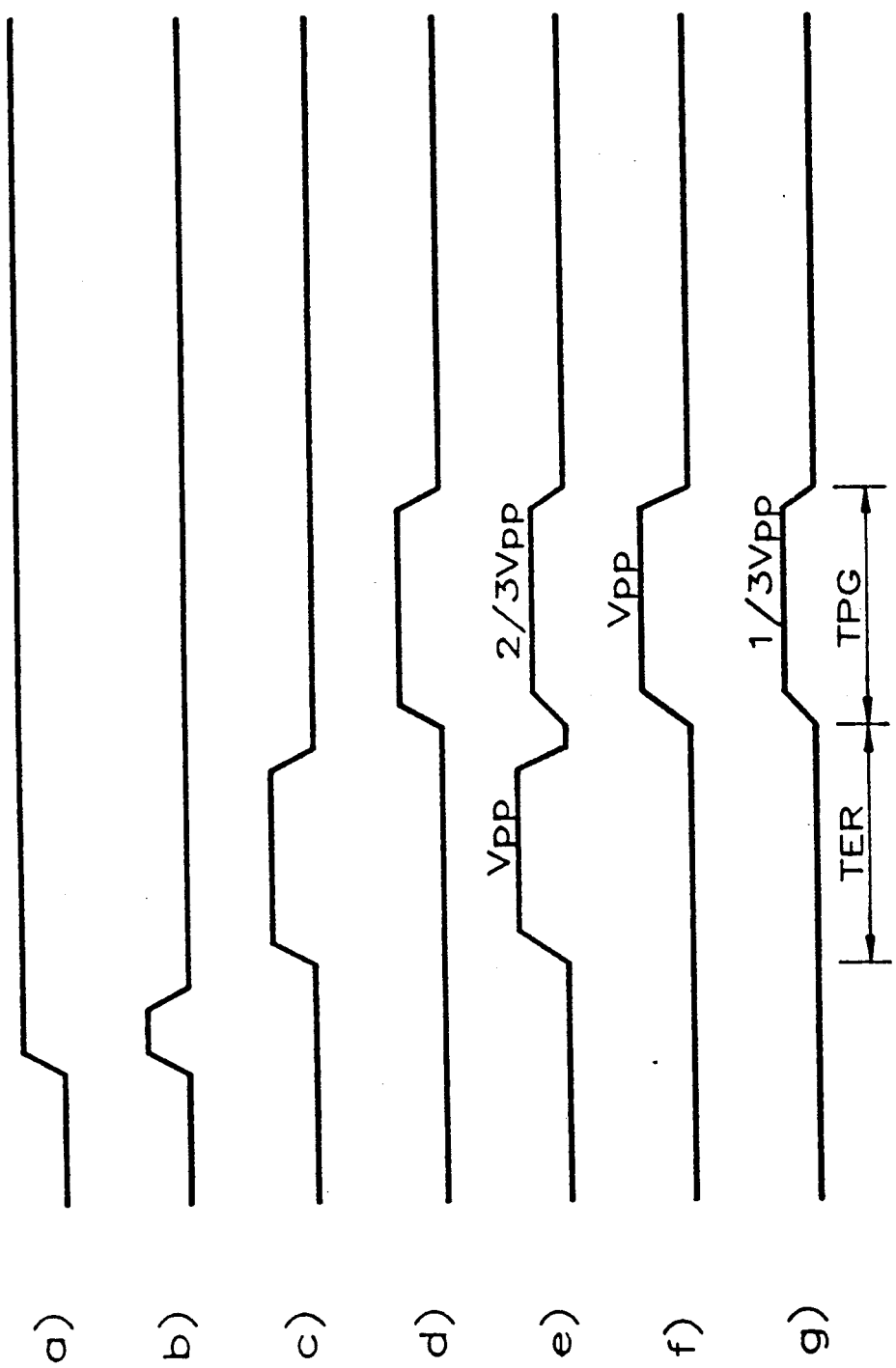
FIG. 2 is a timing diagram for illustrating the operation of the conventional circuit of FIG. 1.
Figure 3:
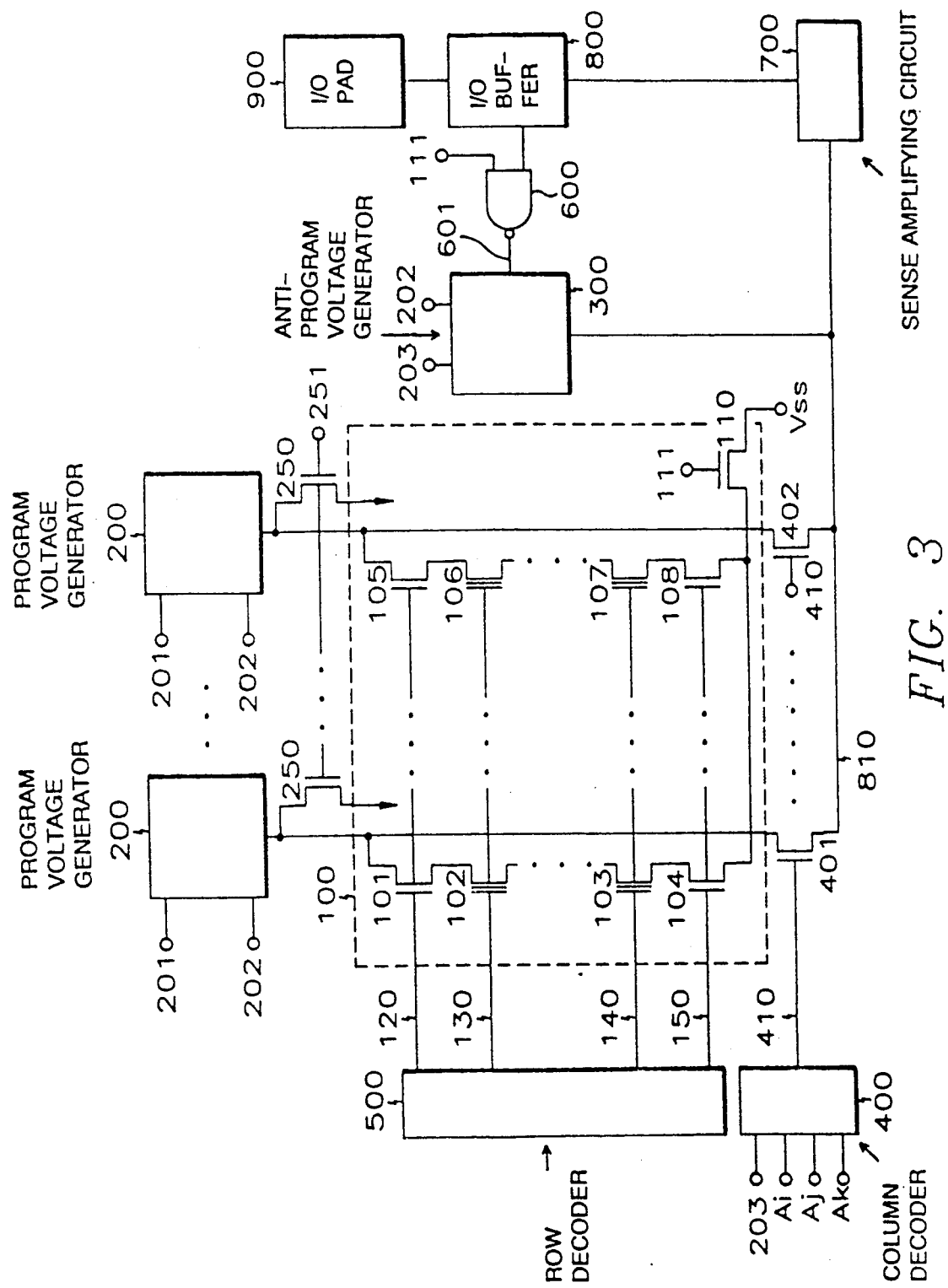
FIG. 3 is a circuit diagram of one embodiment of the present invention.

Referring to FIG. 3 for illustrating the inventive circuit, a NAND type EEPROM cell array 100 comprises a plurality of memory strings, each of which includes a string select transistor 101 . . . 105, N cell transistors 102 . . . 103, 106 . . . 107, and a ground select transistor 104 . . . 108. Each bit line BL of the cell array 100 is connected to a program voltage generating means 200. A row decoder 500 is also connected to a string select line 120, N word lines 130 . . . 140 and the ground select line 150 of the cell array 100. Between each bit line and the input/output data line 810 is connected a column select transistor 401 . . . 402, whose gate receives Y gating signal 410 from a column decoder 400. An anti-program voltage generating means 300 is connected between the input/output data line 810 and a data input/output buffer 800. A discharge transistor 250 comprises a channel connected between each bit line and a ground voltage terminal and, a gate connected to a discharge signal 251. There is also provided a ground connecting transistor 110 with a channel connected between the common source line 109 of the ground select transistors 104 . . . 108 of the array and the ground voltage terminal and with a gate connected to a negative program signal 111. The elements mentioned above can be said to the core of the invention. A sense amplifying circuit 700 is connected between the data input/output buffer 800 and data input/output line 810, externally inputting/outputting the data through an input/output pad 900. Between the anti-program voltage generating means 300 and data input/output buffer 800 is connected a data gating means 600 consisting of a NAND gate for receiving the data outputted from the data input/output buffer and the negative program signal so as to transfer the data to the anti-program voltage generating means 300 according to the state of the negative program signal 111.

To the program voltage generating means 200 are applied pumping clock pulses 202 generated by an oscillator and a program voltage 201 exceeding 15 V generated by a high voltage generating circuit (not shown). The pumping clocks 202 and an anti-program voltage 203 exceeding 5 V are also applied to the anti-program voltage generating means 300. Hereinafter, the program voltage 201 and anti-program voltage 203 will be respectively designated as the first and second high voltages.

Figure 4:
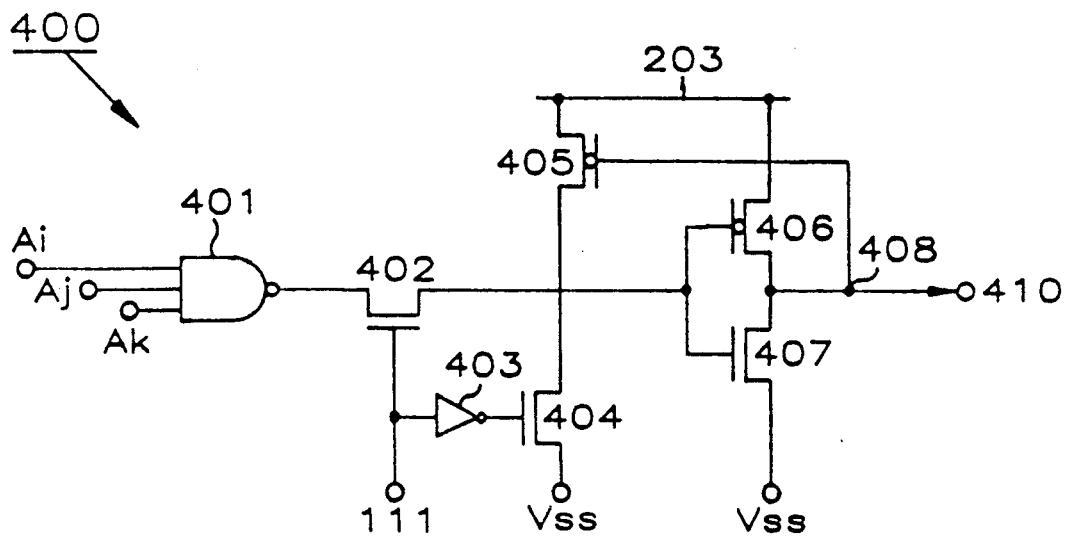
FIG. 4 is an internal circuit diagram of the column decoder (400) of FIG. 3.

With reference to FIG. 4 will now be described the column decoder 400.

The column decoder 400 comprises a NAND gate 401 for receiving the column addresses Al, Aj, Ak, an inverter consisted of PMOS transistor 406 and NMOS transistor 407, a feedback PMOS transistor 405, a gating NMOS transistor 402 and a pull-down NMOS transistor 404. The inverter, with the output connected to the output terminal 408 outputting the column select signal 410, is connected between the anti-program voltage 203 and the ground voltage terminal. The source, gate and drain of the feedback PMOS transistor 405 are respectively connected to the anti-program voltage 203, the output terminal 408 and the input of the inverter. The channel of the gating NMOS transistor 402, with the gate connected to the negative program signal 111, is connected between the NAND gate and inverter. The channel of the pull-down NMOS transistor 404, with the gate connected to the negative program signal inverted by the inverter 403 is connected between the input of the inverter and the ground voltage terminal. In this case, the NAND gate 401 receives the column addresses generated by an external column address buffer (not shown) so as to produce a combined logic state therefrom. The inverter comprising a PMOS transistor 406 and an NMOS transistor 407, and the feedback PMOS transistor 405 serve to produce the anti-program voltage 20 that is the second high voltage. The gating NMOS transistor 402, pull-down NMOS transistor 404 and inverter 403 constitute a gating means to control to produce the column select signal according to the column address or the anti-program voltage 203 according to the state of the negative program signal 111.

Figure 5:
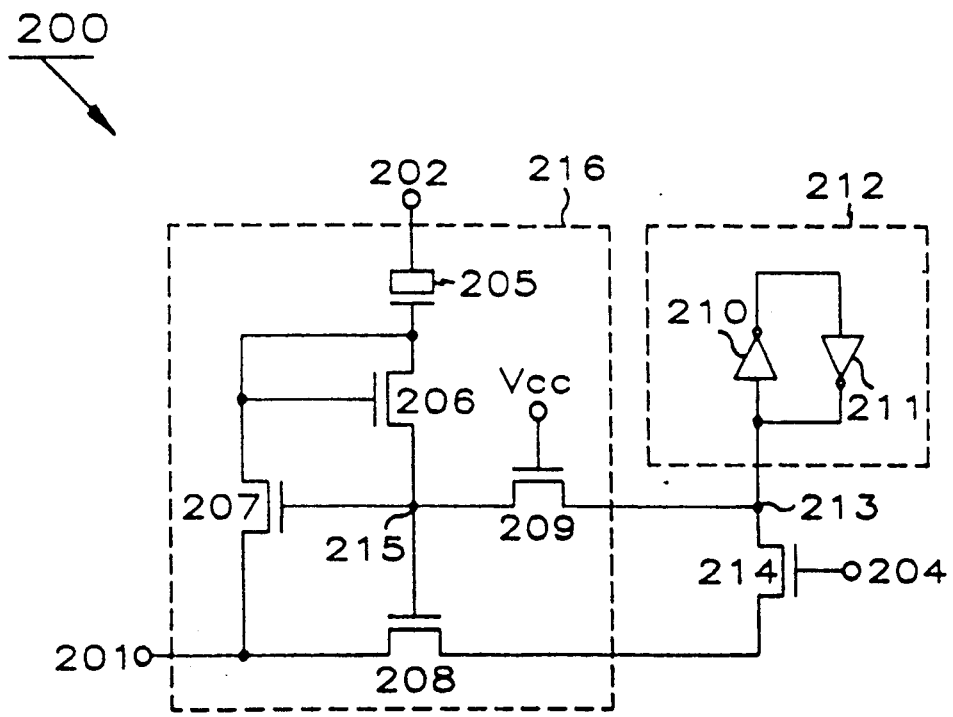
FIG. 5 is an internal circuit diagram of the program voltage generating means (200) of FIG. 3.

Referring to FIG. 5, the program voltage generating means 200 comprises a first high voltage pumping circuit 216 for receiving the program voltage (or the first high voltage) 201 and the pumping clock pulses 202, latch circuit 212 and transfer means 214.

The first high voltage pumping circuit 216 comprises a capacitor 205 having an electrode for receiving pumping clock pulses, a first insulating gate transistor 206 with the drain and gate connected to the other electrode of said capacitor 205, a second voltage node 215 connected to the source of the first insulating gate transistor, a second insulating gate transistor 207 with the gate, source and drain respectively connected to the second voltage node 215, the gate of the first insulating gate transistor 206 and the first high voltage 201, a third insulating gate transistor 208 with the gate, drain and source respectively connected to the second voltage node 215, the high voltage 201 and one of the bit lines 250, and a fourth insulating gate transistor 209 with the drain, gate and source respectively to said second voltage node 215, voltage source and a first voltage node 213 connected to the output terminal of said latch circuit 212.

In this case, the fourth insulating gate transistor 209 serves to control the output of the first high voltage pumping circuit 216 according to the voltage state of the first voltage node 213 connected to the output of the latch circuit 212 The source of the third insulating gate transistor 208 connected to the bit line is the output terminal of the first high voltage pumping circuit 216. The latch circuit 212 comprises two inverters 210, 211.

The transfer means 214 comprises an NMOS transistor with the channel connected between the first voltage node 213 and a bit line BL with and the gate connected to a bit line select signal, and transfers to the latch circuit 212 the data inputted through the data input/output line 810 and bit line. Hence, the transfer means 214 conducts only to transmit the input data, and does not conduct when erasing and programming. In this case, the output of the program voltage generating means 200 provided to the bit line depends on the state of the data stored in the latch circuit 212.

Figure 6:
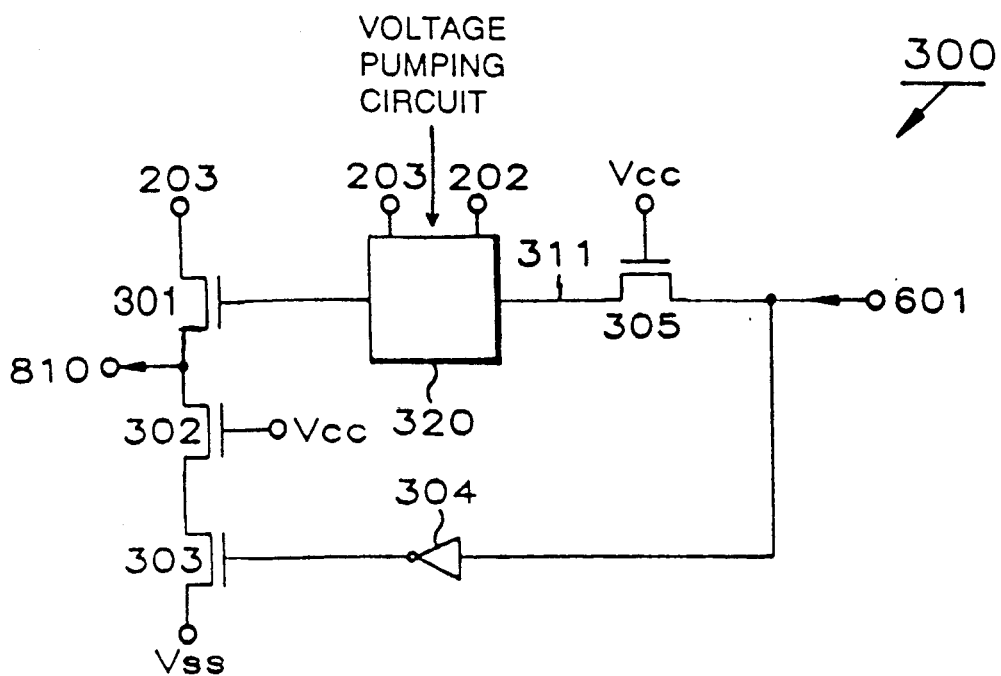
FIG. 6 is an internal circuit diagram of the anti-program voltage generating means (300) of FIG. 3.

Referring to FIG. 6, the anti-program voltage generating means 300 comprises the second high voltage pumping circuit 320 for receiving the output of the data gating means 600 of FIG. 3, the pumping clocks 202 and the second high voltage (or anti-program voltage) 203, a first output transistor 301 with a channel connected between an output terminal 310 connected to the data input/output line 810 and the second high voltage 203 and with a gate connected to the output of the second high voltage pumping circuit 320, and a second output transistor 303 with a channel connected between the output terminal 310 and the ground voltage terminal and a gate connected to the output inverted by the inverter 304 of the data gating means 600.

An NMOS transistor 302, with the gate connected to the source voltage VCC is interposed between the output terminal 810 and the second output transistor 303. Another NMOS transistor 305 is also interposed between the data gating means 600 and the second high voltage pumping circuit 320 with the gate connected to the source voltage VCC.

The anti-program voltage generating means 300 provides the second high voltage (5-10 V) to the data input/output line 810 or the ground level signal according to the output state of the data gating means 600 of FIG. 3 that is driven in the same logic state as the program signal.

Figure 7:
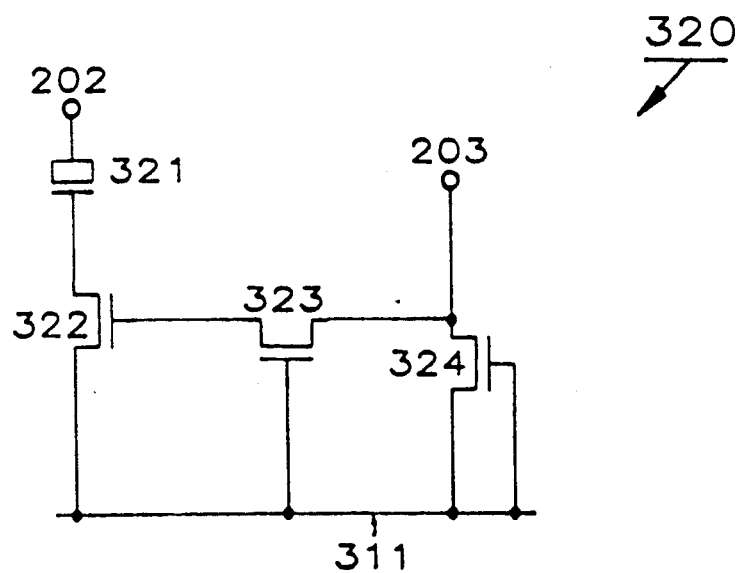
FIG. 7 is a detailed circuit diagram of the second high voltage pumping circuit (320) of FIG. 6.

Referring to FIG. 7, the second high voltage pumping circuit 320 used in the anti-program voltage generating means 300 comprises a capacitor 321 having an electrode for receiving the pumping clock pulses 202, a first NMOS transistor 322 with the drain and source respectively connected to the other electrode of the capacitor 321 and the output line 311, a second NMOS transistor 323 with the source, drain and gate respectively connected to the gate of the first NMOS transistor 322, the second high voltage 203 of 5-10 V that is the anti-program voltage and the output line 311, and a third NMOS transistor 324 with the drain connected to the second high voltage 203. The gate and source of the third NMOS transistor are connected to the output line 311. The second high voltage pumping circuit 320 is a common charge pump circuit.

Referring to FIGS. 3-9, the operation of the inventive circuit will be described.

Figure 8:
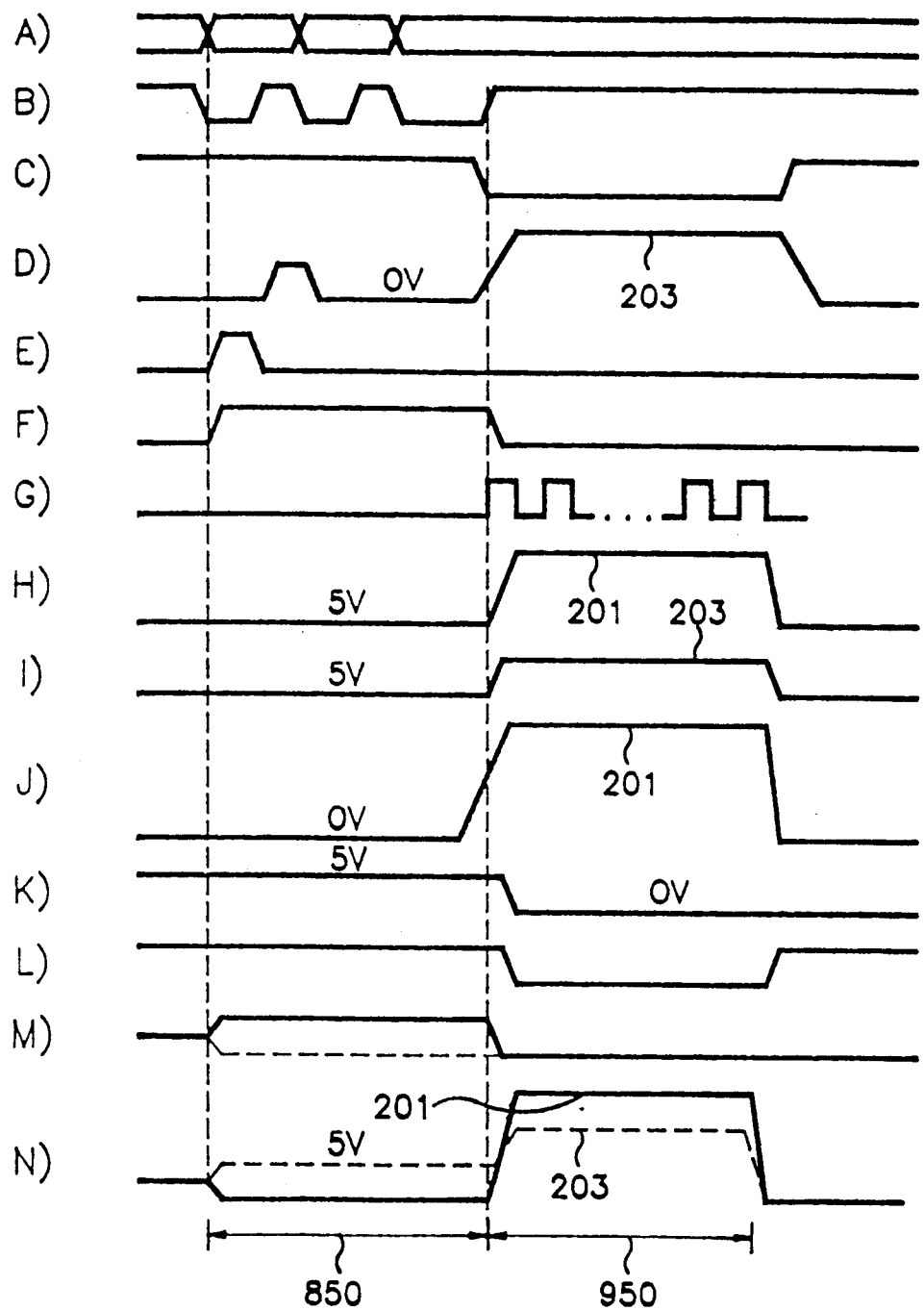
FIG. 8 is a timing diagram for illustrating one embodiment of the inventive method.
Figure 9:
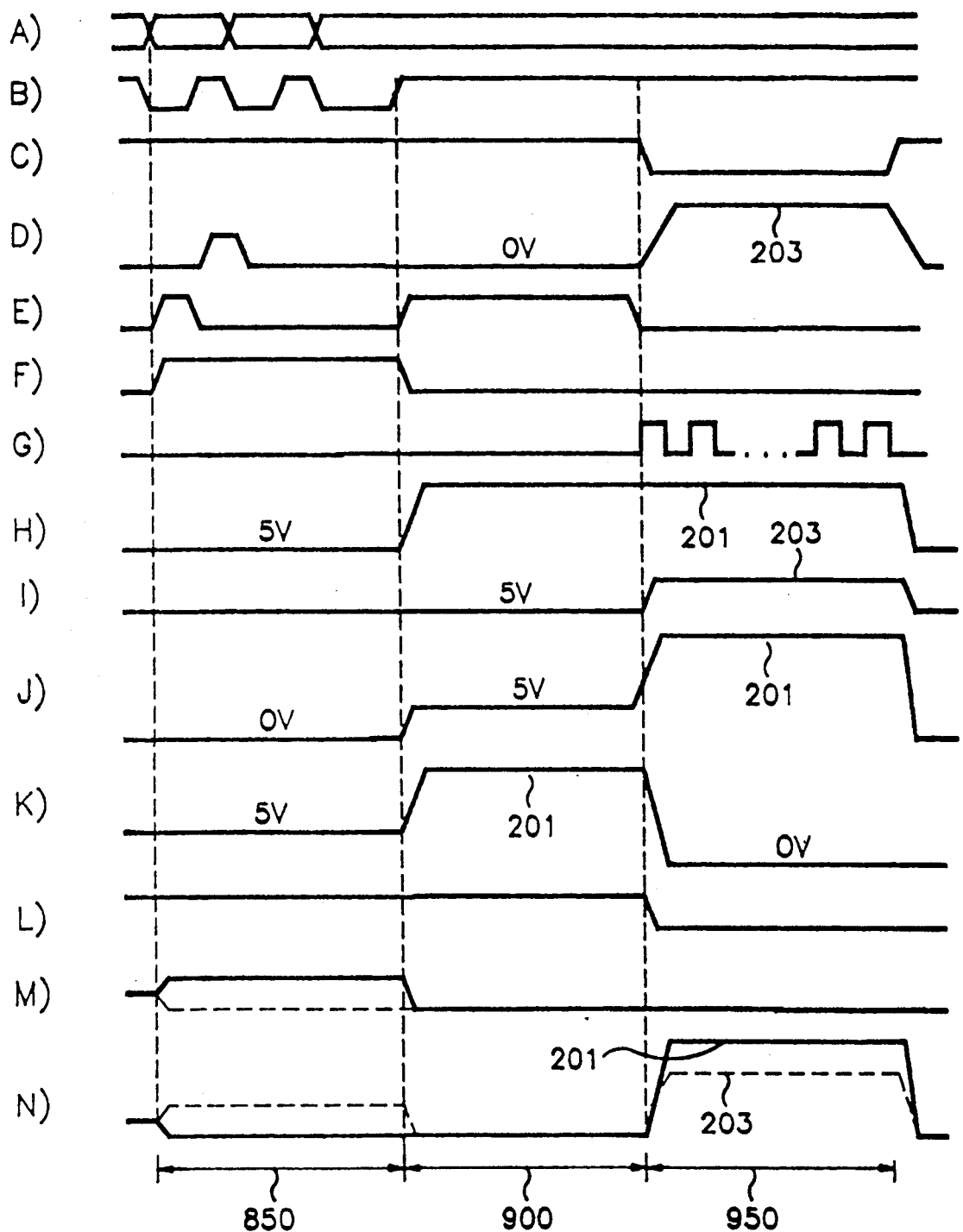
FIG. 9 is a timing diagram for illustrating another embodiment of the inventive method.

In FIGS. 8 and 9, the letter A represents the address signal, B the write enable signal, C the negative program signal, D the Y gating signal 410 of FIG. 3, E the discharge signal 251 of FIG. 3, F the bit line select signal 204 of FIG. 5, G the pumping clock pulses 202, H the first high voltage 201, I the second high voltage 203, J the voltage of the string select line 120 selected in FIG. 3, K the voltage of the selected word line, L the voltage of the ground select line 150 of FIG. 3, and M and N respectively the input data and the bit line.

Referring to FIG. 8, there are depicted two separate operating terms, that is, the data transmission term 850 during which the input data is transmitted and stored into the latch circuit 212 of FIG. 3 and the programming term 950 during which the data stored in the latch circuit 212 is written into a selected memory cell. During the programming term 950 is applied the anti-program voltage to the memory cells not selected according to the data stored in the latch circuit 212.

Firstly, in the data transmission term 850, the negative program signal 111 (C) is disabled ("high" state) and the bit line select signal 204 (F) is maintained "high", so that the input data M may be transmitted to the latch circuit 212 of the program voltage generating means 200. The discharge signal 251 (E) becomes "high" during the first short portion of the term so as to turn on the discharge transistor 250 connected between the bit line and ground voltage terminal, thus putting the voltage of the bit line into the ground level. The write enable signal B is enabled at every time that the external address signal A is changed. This signal causes the column decoder 400 to turn on the gating NMOS transistor 402 so as to produce the Y gating signal 410 (D) according to the inputted column address signal because the negative program signal 111 is "high".

Since the Y gating signal 410 (D) is high enough to turn on the column select transistors 401, 402 of NMOS type, the feedback PMOS transistor 405 of the column decoder 400 connected to the second high voltage 203 is turned off and the PMOS transistor 406 of the inverter 406, 407 is not operated. Thus, the column decoder 400 produces the Y gating signal (or column select signal) of the source voltage level (5 V) to select a column or bit line in the data transmission term 850.

On the other hand, the data gating means 600 interposed between the data input/output buffer 800 and the anti-program voltage generating means 300 applies the input data M as having the effective value to the anti-program voltage generating means 300 because the negative program signal 111 (C) is "high". In the second high voltage pumping circuit 320, if the input data M is in the state of "1", the third NMOS transistor 324 is turned off because it source and drain voltage become "high" together. Accordingly, the second high voltage pumping circuit 320 can not operate. So, the input data M of the "1" is transferred to the data input/output line 820 by the operation of the firs output transistor 301 turned on and the second output transistor 303 turned off. Also in the case of the input data M being "0", the second high voltage pumping circuit 320 is not operated. And the input data M in "0" state can be supplied to the data input/output line(810) by the operation of the first output transistor 301 turned off and the second output transistor 303 turned on. Thus, the input data applied to the input/output line 810 has "1" state or "0" state according to whether the input data M is applied having "1" state or "0" state to the anti-program voltage generating means 300.

The data applied to the data input/output line 810 is stored in the latch circuit 212 through the column select transistors 401, 402, bit line BL and the transfer means 214 turned on by the bit line select signal 204 (F) of "high" state and the string select line J becomes "low" so as to cut the connection between the bit line and memory cell, and the ground connect transistor 110 is turned on by the negative program signal 111 (C), together with the ground select transistors 104 . . . 108 turned on by the ground select signal 150 of "high" state so as to connect the memory cells to the ground voltage terminal. Namely, in the data transmission term 850, there is opened only the data path from the data input/output buffer 800 to the latch circuit 212.

During the term described above, both the first and second high voltages H and I are in the source voltage level (5 V), which may be adjusted by the high voltage generating circuit (not shown) in the system, which is well known in this technical field. The second high voltage may be also the source voltage.

After the data transmission to the latch circuit 212 is completed, the operating step begins to erase the data stored in the memory cell or newly program it.

FIG. 8 shows the programming term 950 directly connected with the data transmission term 850, while FIG. 9 shows automatic erasing term 900 between the two terms in order to illustrate the overall operation of the EEPROM.

First, prior to the description of the operation of the EEPROM in the programming term 950, the operation will be described in the automatic erasing term 900.

In order to erase the data stored in the memory cell, the erasing voltage more than about 15 voltage should be applied to the selected word line, and the bit line should be in the ground state.

Referring to FIG. 9, the negative program signal 111 (C) continues to be in "high" state in the automatic erasing term 900, when the discharge signal 251 (E) becomes "high" to turn on the discharge transistor 250 in order to put the voltage of the bit line into the ground level. The bit line select signal 204 (F) becomes "low" so as to separate the bit line from the latch circuit 212. And the row decoder 500 applies a signal of the source voltage level (5 V) to the selected string select line 120 (J), and the selected word line K receives the first high voltage 201 more than about 15 V, thus erasing the data stored in the memory cell connected to the selected word line. During this time, the ground select line 150 (L) receives a signal of the source voltage level from the row decoder 500, so that each of the memory strings communicates with the ground voltage terminal through the ground connecting transistor 110. In the automatic erasing term 900, the memory cells are erased in pages (one page referred to as the group of memory cells connected to a single word line), while the column decoder 400 produces the Y gating signal 410 (D) of "low" state because of the column address signals Ai, Aj, Ak being not changed.

Thus, if the data transmission term 850 or the automatic erasing term 900 expires, the negative program signal 111 (C) is enabled "low" so as to start the programming term 950.

Then, the external address signal (A) is not changed until the end of a given programming, when the write enable signal (B) is disabled. During this time, the discharge signal 251 (E) is disabled "low" so as not to affect the bit line voltage, while the bit line select signal 204 (F) maintains "low" state so as to separate the bit line from the latch circuit 212. Namely, the transfer means 214 controlled by the bit line select signal 204 (F) is turned on only in the data transmission term 850, but turned off in the automatic erasing term 900 and programming term 950. This is to cause the program voltage generating means 200 to adjust the output of the first high pumping circuit 206 according to the data stored in the latch circuit 212.

When the latch circuit 212 stores the data of "1" state, the "high" level voltage of the first voltage node 213 is transmitted to the second voltage node 215 so as to turn on the second and third insulating gate transistors 207 and 208. Then, the first high voltage 20 is transmitted to the gate and drain of the first insulating gate transistor 206, which continuously raises the voltage of the second voltage node 215 in response to the pumping clock pulses 202 (G), so that the gate voltages of the second and third insulating gate transistors 207, 208 are alternately raised. Hence, the first high voltage 201 (H) is applied through the third insulating gate transistor 208 to the bit line (N). At this time, in the memory cell array 100, the voltage of the corresponding string select line (J) is raised to the level (15 V or more) of the first high voltage 201 by the output of the row decoder 500, and the voltage of the word line K selected for programming goes into the ground level, so that the first high voltage 201 (H) for programming can be applied to the drain of the selected memory cell. Then, the voltage of the ground connecting line (L) is put into the ground level so as to turn off the ground select transistors 104, 108, and the ground connecting transistor 110 is also turned off by the negative program signal 111 (C) of "low" state.

On the other hand, the output of the data gating means 600 consisting of a NAND gate as shown in FIG. 3 is always "high", because one input thereof receives the negative program signal 111 (C) of "low" state. Since the voltage of the second high voltage 203 is 5–10 V in the programming term 950, the second and third NMOS transistors 323, 324 of the second high voltage pumping circuit 320 of the anti-program voltage generating means (300) are turned on. Then, the first NMOS transistor 322 receives the second high voltage 203 (I) of 5–10 V through the gate so as to raise the voltage of the output line 311 in response to the pumping clock pulses 202 (G). This repeated operation causes the second high voltage pumping circuit 320 to produce the second high voltage 203 (I) of 5–10 V applied to the drain of the first output transistor 301 that is transferred to the data input/output line 810.

In the column decoder 400 shown in FIG. 4, since the negative program signal 111 (C) is "low", the gating NMOS transistor 402 is turned off so as to block the output according to the column address signals. The pull-down NMOS transistor 404 is turned on, so that the voltage of the input node 411 of the inverter 406, 407 becomes "low", thus the PMOS transistor 406 of the inverter is conducted. Consequently, the output 410 of the column decoder 400, i.e., the Y gating signal (D), becoming at the level of the second high voltage 203 of 5–10 V, is applied to the gate of the column select transistor 401 . . . 402.

Since the output of the column decoder 400 and the voltage of the data input/output line 810 have the second high voltage 203 of 5–10 V, the voltage passed through the column select transistor 401 . . . 402 is the value substrated the threshold voltage of the column select transistor from the second high voltage 203 of 5–10 V. This voltage is smaller than the first high voltage 201 so that it cannot affect the selected bit line, but it can affect the bit line not selected so as to prevent the memory cell not selected from being erased.

As shown in FIGS. 8 and 9, the voltage (shown in solid line) of the bit line N selected during the programming term 950 is maintained with the first high voltage 201 (or programming voltage) exceeding 15 V, while the voltage (shown in dotted line) of the bit line not selected is maintained with the second high voltage 203 (anti-programming voltage) of 5–10 V. Here, the voltage of the word line not selected may be ignored because the memory cell array employed in the inventive circuit is a NAND type with each memory string provided with the string select transistor 101 . . . 105 and the first high voltage is applied to the selected string select line (J) during the programming term 950.

As described above, in order to prevent the memory cell from being unintentionally programmed and construct the system by using a minimum number of elements, there is provided means for causing the data input/output buffer to apply the anti-program voltage to all the bit lines. It will be readily noted by a person having the ordinary knowledge in this technical field that the column decoder 400, anti-program voltage generating means 300 and program voltage program generating means 200 shown in FIG. 3 may be constructed otherwise without departing from the scope of the present invention.

Thus, the present invention provides a means for preventing the memory cell of a EEPROM from being unintentionally programmed or erased by employing a minimum number of constituent elements, so that reliability is ensured in fabricating a highly integrated memory.

What is claimed is:

1. In an electrically erasable and programmable semiconductor memory comprising a memory cell array having a plurality of memory strings connected to a plurality of word lines and bit lines, each memory string comprising a string select transistor, a given number of memory cells and a ground select transistor, a row decoder connected to said plurality of word lines, a data bus and a data input/output buffer, a program optimizing circuit comprising:

program voltage generating means comprising a first high voltage pumping circuit for transferring a high voltage of a first level to said bit lines in response to clock pulses, a latch circuit and transfer means connected between output nodes of said latch circuit and said bit lines;

column decoder means for outputting either one of a second high voltage of a second level and a column address signal according to a program signal;

a plurality of column select transistors, each column select transistor having a channel connected between said data bus and a bit line of said plurality of bit lines, and a gate coupled to receive the alternative output signal of said column decoder means; and anti-program voltage generating means interposed between said data input/output buffer and said data bus for transferring one of the output of said input/output buffer and the second high voltage to said data bus according to said program signal.

2. A program optimizing circuit as claimed in claim 1, wherein the first high voltage pumping circuit of said program voltage generating means comprises:

a capacitor having an electrode for receiving said clock pulses;

a first insulating gate transistor having a drain and a gate connected to another electrode of said capacitor;

a second voltage node formed at a source of said first insulating gate transistor;

a second insulating gate transistor having a gate, a source and a drain respectively connected to said second voltage node, the gate of said first insulting gate transistor and to receive said first high voltage;

a third insulating gate transistor having a gate, a drain and a source respectively connected to said second voltage node, to receive said first high voltage and to one of said bit lines;

a fourth insulating gate transistor having a drain, a gate and a source respectively connected to said second voltage node, a voltage source and a first voltage node formed at an output terminal of said latch circuit; and said transfer means comprising an insulating gate transistor having a channel connected between said first voltage node and a bit line and a gate connected to a given bit line select signal according to said program signal.

3. A program optimizing circuit as claimed in claim 2, further comprising discharging means having a channel connected between said bit lines and ground, and a gate connected to a give discharge signal.

4. A program optimizing circuit as claimed in claim 1, wherein said column decoder means comprising selecting means for selectively outputting one of the input column address signals in dependence upon said second high voltage, said selecting means being controlled by said program signal.

5. A program optimizing circuit as claimed in claim 1, wherein said anti-program voltage generating means comprises:

data gating means for receiving the output of said data input/output buffer and said program signal;

a second high voltage pumping circuit for receiving said second high voltage and the output of said data gating means to output said second high voltage during said program signal being enabled in response to said clock pulses;

a first transistor having a gate and a drain respectively connected to the output of said second high voltage pumping circuit and said second high voltage;

a second transistor having a channel interposed between the source of said first transistor and ground, and a gate connected to the inverted output of said data gating means; and an output terminal interposed between said first and second transistors.

6. A program optimizing circuit as claimed in claim 1, wherein said first high voltage has voltages approximately in the range of 15 to 20 volts, and said second high voltage has voltages approximately in the range of 5 to 10 volts.

7. A program optimizing circuit as claimed in claim 1, further including ground connecting means having a channel connected between a common source line of said ground select transistors within the memory string of said memory cell array and the ground, and a gate connected to said program signal.

8. In an electrically erasable and programmable semiconductor memory comprising a memory cell array having a plurality of memory strings connected to a plurality of word lines and bit lines, said memory string comprising a string select transistor, a given number of memory cells and a ground select transistor, and a data bus, a program optimizing circuit comprising:

program voltage generating means comprising a first high voltage pumping circuit for receiving a first high voltage of a first level to transfer said first high voltage to said bit lines in response to clock pulses, a latch circuit and a transfer means connected between the output node of said latch circuit and said bit lines;

discharging means having a channel connected between said bit lines and a ground and a gate connected to a given discharge signal;

ground connecting means having a channel connected between a common source line of said ground select transistor within said memory string and ground, and a gate connected to a program signal;

column decoder means for outputting either one of a second high voltage of a second level and a column address signal according to said program signal;

a plurality of column select transistors, each column select transistor having a channel connected between said data bus and said plurality of bit lines and a gate coupled to receive the alternative output signal of said column decoder means;

data gating means for receiving external inputted data, said external inputted data being controlled by said program signal; and anti-program voltage generating means interposed between said data gating means and said data bus for receiving said second high voltage, and transferring one of said second high voltage and said external inputted data to said data bus according to an output state of said data gating means.

9. A program optimizing circuit as claimed in claim 8, wherein the first high voltage pumping circuit of said program voltage generating means comprises:

a capacitor having a first electrode for receiving pumping clock pulses;

a first insulating gate transistor having a drain and a gate commonly connected to a second electrode of said capacitor;

a second voltage node connected between a source of said first insulating gate transistor and said first high voltage;

a third insulating gate transistor having a gate, a drain and a source respectively connected to said second voltage node, said high voltage and one of said plurality of bit lines;

a fourth insulating gate transistor having a drain, a gate and a source respectively connected to said second voltage node, a voltage source and a first voltage node formed at an output terminal of said latch circuit; and said transfer means comprising an insulating gate field effect transistor having a channel connected between said first voltage node and a bit line, and a gate connected to a bit line select signal controlled by said program signal.

10. A program optimizing circuit as claimed in claim 8, wherein said column decoder means comprises selecting means for selectively outputting one of the inputted column address signals and said second high voltage, said selecting means being controlled by said program signal.

11. A program optimizing circuit as claimed in claim 8, wherein said anti-program voltage generating means comprises:
    a second high voltage pumping circuit for receiving said second high voltage and the output of said data gating means to output said second high voltage during said program signal being enabled in response to said pumping clock pulses;
    a first transistor having a gate and a drain respectively connected to the output of said second high voltage pumping circuit and said second high voltage;
    a second transistor having a channel connected between the source of said first transistor and ground, and a gate connected to the inverted output of said data gating means; and
    an output terminal interposed between said first and second transistors and connected to said data bus.

12. A program optimizing circuit as claimed in claim 8, wherein said first high voltage has voltages approximately in the range of 15 to 20 volts, and second high voltage has voltages approximately in the range of 5 to 10 volts.

13. An electrically erasable and programmable semiconductor memory, comprising:
    a plurality of word lines and bit lines;
    a memory cell array consisting of a plurality of memory strings connected to said plurality of word lines and bit lines, said memory string comprising a string select transistor, a given number of memory cells and a ground select transistor;
    a row decoder connected to said plurality of word lines;
    a data bus and a data input/output buffer;
    a column decoder for outputting one of a second high voltage of a given level and a column address signal according to a program signal;
    a plurality of column select transistors having a plurality of channels connected between said data bus and said plurality of bit lines, and a plurality of gates coupled to receive the alternative output signal of said column decoder;
    program voltage generating means comprising a first high voltage pumping circuit for receiving a first high voltage of a first level to transfer said first high voltage to said bit lines in response to pumping clock pulses, a latch circuit and a transfer means connected between an output node of said latch circuit and said bit lines;
    discharging means having a channel connected between said bit lines and ground, and a gate connected to a given discharge signal;
    ground connecting means having a channel connected between a common source line of said ground select transistors of said memory string and ground, and a gate connected to said program signal;
    data gating means for receiving the output of said data input/output buffer and said program signal; and
    anti-program voltage generating means interposed between said data gating means and said data bus for receiving said second high voltage and transferring one of said second high voltage and the output data of said data input/output buffer to said data bus according to an output of said data gating means.

14. An electrically erasable and programmable semiconductor memory as claimed in claim 13, wherein the first high voltage pumping circuit of said program voltage generating means comprises:
    a capacitor having a first electrode for receiving pumping clock pulses;
    a first insulating gate transistor having a drain and a gate commonly connected to a second electrode of said capacitor;
    a second voltage node formed at a source of said first insulating gate transistor;
    a second insulting gate transistor having a gate, a source and a drain respectively connected to said second voltage node, the gate of said first insulating gate transistor and said first high voltage;
    a third insulating gate transistor having a gate, a drain and a source respectively connected to said second voltage node, said high voltage and one of said bit lines;
    a fourth insulating gate transistor having a drain, a gate and a source respectively to said second voltage node, voltage source and a first voltage node formed at an output terminal of said latch circuit; and
    said transfer means comprising an insulating gate transistor having a channel connected between said first voltage node and a bit line, and a gate connected to a bit line select signal controlled by said program signal.

15. An electrically erasable and programmable semiconductor memory as claimed in claim 13, wherein said column decoder comprises selecting means for selectively outputting one of the inputted column address signals in dependence upon said second high voltage, said selecting means being controlled by said program signal.

16. An electrically erasable and programmable semiconductor memory as claimed in claim 13, wherein said anti-program voltage generating means comprises:
    a second high voltage pumping circuit for receiving said second high voltage and the output of said data gating means to output said second high voltage during said program signal being enabled in response to said pumping clock pulses;
    a first transistor having a gate and a drain respectively connected to the output of said second high voltage pumping circuit and said second high voltage;
    a second transistor having a channel connected between a source of said first transistor and ground, and a gate connected to the inverted output of said data gating means; and
    an output terminal connected to said data bus interposed between said first and second transistors.

17. An electrically erasable and programmable semiconductor memory as claimed in claim 13, wherein said first high voltage has voltages approximately in the range of 15 to 20 volts, and second high voltage has voltages approximately in the range of 5 to 10 volts.

18. In an electrically erasable and programmable semiconductor memory comprising a memory cell array consisting of a plurality of memory cells connected to a plurality of word lines and bit lines, a row decoder connected to said plurality of word lines, a column decoder for receiving column address signals, a data input/output line, a data bus and data input/output buffer, and a plurality of column select transistors having a plurality of channels connected between said data bus and said plurality of bit lines, and a plurality of gates coupled to receive the output signal of said column decoder, a program optimizing method comprising the steps of:

storing available data from said input/output buffer stored in a latch circuit, if a program signal is disabled, through a gate gating means, an anti-program voltage means, the column select transistors, the bit lines and a transfer means, said anti-program voltage generating means being interposed between said data input/output line and said data input/output buffer for pumping a second high voltage of said program signal, said data gating means being connected between said data input/output buffer and anti-program voltage generating means and controlled by said program signal; and turning off said transfer means and applying a first high voltage from a program voltage generating means to a selected bit line and applying said second high voltage to all of the gates and the channels of the column select transistors connected to the bit lines, said program voltage generating means connected to each of the bit lines and comprising a first high voltage pumping circuit, if said program signal is enabled, said latch circuit and said transfer means connected between said latch circuit and said selected bit line, said transfer means being controlled by a bit line selected signal according to said program signal.

19. A program optimizing method as claimed in claim 18, characterized in that said column decoder selectively outputs one of the inputted column address signals in dependence upon said second high voltage according to said program signal.

20. A program optimizing method as claimed in claim 18, characterized in that said first voltage pumping circuit is operated according to the output of said latch circuit.

21. A program optimizing method as claimed in claim 18, characterized in that a data gating means, for receiving the output of said data input/output buffer and said program signal, is connected between said anti-program voltage generating means and data input/output buffer for disabling an input data.

22. A program optimizing method as claimed in claim 18, characterized in that said first and second high voltages have respective voltages of 15-20 volts and 5-10 volts.

23. In an electrically erasable and programmable semiconductor memory comprising a memory cell array consisting of a plurality of memory cells connected to said plurality of word lines and bit lines, said memory string comprising a string select transistor, a given number of memory cells and a ground select transistor, a row decoder connected to said plurality of word lines, a data input/output line, a data bus and a data input/output buffer, and a plurality of column select transistors having a plurality of channels being connected between said data bus and said plurality of bit lines, and a plurality of gates coupled to receive the output signal of said column decoder, a program optimizing method comprising the steps of:

connecting to each of said bit lines a program voltage generating means comprising a first high voltage pumping circuit for receiving a first high voltage of a given level to transfer it to said bit lines in response to pumping clock pulses, a latch circuit and a transfer means connected between said latch circuit and said bit lines, said transfer means being controlled by a bit line select signal according to a program signal; and storing available data from the input/output buffer, if a program signal is disabled, into a latch circuit through a data gating means, an anti-program voltage generating means, the column select transistors, the bit lines and the transfer means, said anti-program voltage generating means being connected between said data input/output buffer and data bus and controlled by said program signal;

ground the bit lines by turning on of the ground select transistor and turning off, if said program signal is disabled, said transfer means, said ground select transistor having a gate connected to said program signal, said transfer means controlled by a bit line select signal according to said program signal; and turning off said transfer means and applying said first high voltage from a generating means to a selected bit line and applying, if said program signal is enabled, a second high voltage to all of the gates and channels of the column select transistors connected to the bit lines, said program voltage generating means being connected to each of the bit lines.

24. A program optimizing method as claimed in claim 23, characterized in that said column decoder selectively outputs one of column address signals and said second high voltage according to said program signal.

25. A program optimizing method as claimed in claim 23, characterized in that said first voltage pumping circuit is operated according to an output of said latch circuit.

26. A program optimizing method as claimed in claim 23, characterized in that a data gating means, for receiving output of said data input/output buffer and said program signal, is connected between said anti-program voltage generating means and said data input/output buffer for disabling an input data.

27. An electrically erasable and programmable semiconductor memory device, comprising:

a plurality of bit lines arranged in columns;

a plurality of word lines arranged in rows;

a memory cell array consisting of a plurality of memory strings arranged in rows and columns connected to said plurality of bit lines and said plurality of word lines, each memory string arranged in a column comprising a string select transistor, a plurality of memory cells and a ground select transistor, each ground select transistor of each memory string having a source connected to a common source line, said common source line connected to a ground connect transistor for enabling transmission of a program signal to access to said common source line;

row decoder means coupled to said plurality of bit lines arranged in columns, for providing a first voltage signal in dependence upon reception of clock pulses to access said plurality of memory cells via a plurality of discharge transistors;

column decoder means connected to said plurality of bit lines arranged in a column, for providing a column address signal in dependence upon reception of a second voltage signal to access to said plurality of memory cells via a plurality of column select transistors, each column select transistor having a channel connected to each bit line of said plurality of bit lines and a data bus; and anti-program voltage generator means for enabling transmission of one of said second voltage signal and a ground signal to said data bus in dependence upon reception of said second voltage signal, said clock pulses and a data gate signal, said data gate signal being responsive to said program signal.

28. An electrically erasable programmable semiconductor memory device as claimed in claim 27, further comprises:
sense amplifier means for providing an amplified signal by sensing and amplifying data in said data bus;
buffer means interposed between said sense amplifier means and an input/output terminal, for providing an intermediate signal in dependence upon said amplified signal and an input signal from said input/output terminal; and
gate means for providing said data gate signal in dependence upon reception of said intermediate signal and said program signal.

29. An electrically erasable programmable semiconductor memory device as claimed in claim 27, wherein said first voltage signal has a program voltage approximately of 15 to 20 volts, and said second voltage signal has an anti-program voltage approximately of 5 to 10 volts.

30. An electrically erasable programmable semiconductor memory device as claimed in claim 29, wherein said column decoder means comprises:
a NAND gate coupled to receive a plurality of column addresses, for providing an intermediate signal; and
a plurality of transistors coupled to receive said intermediate signal and said program signal, for providing said column address signal in dependence upon said second voltage signal.

31. An electrically erasable programmable semiconductor memory device as claimed in claim 29, wherein said program voltage generator comprises:
first voltage driver means for driving said first voltage signal to selected bit lines in dependence upon reception of said clock pulses;
latch means for latching said first voltage signal; and
transfer means interposed between said latch means and said first voltage driver means for transmitting said first voltage signal to ones of said plurality of bit lines in dependence upon reception of a bit line select signal.

32. An electrically erasable programmable semiconductor memory device as claimed in claim 31, wherein said first voltage driver means comprises:
a capacitor having a first electrode coupled to receive said clock pulses;
a first transistor having a gate and a first channel connected to a second electrode of said capacitor;
a second transistor having a first channel connected to the gate and the first channel of said first transistor, and a second channel connected to said first voltage source;
a third transistor having a first channel connected to said first voltage source and a second channel connected to said transfer means;
a first voltage node formed at a junction of a second channel of said first transistor, a gate of said second transistor and said third transistor; and
a fourth transistor having a gate connected to a power supply source, first channel connected to said first voltage node and a second channel connected to said transfer means.

33. An electrically erasable programmable semiconductor memory device as claimed in claim 29, wherein each discharge transistor from said plurality of discharge transistors interposed between said program generator means and said memory cell array, each discharge transistor having a gate coupled to receive a selected discharge voltage, and a channel connected to each bit line and ground.

34. An electrically erasable programmable semiconductor memory device as claimed in claim 29, wherein said anti-program voltage generator means comprises:
a first transistor having a gate coupled to receive a power supply source, a first channel coupled to receive said data gate signal;
second voltage driver means connected to a second channel of said first transistor, for providing an intermediate signal in dependence upon reception of said clock pulses and said second voltage signal;
a second transistor having a gate coupled to receive said intermediate signal, and a first channel coupled to receive said second voltage signal;
an inverter for providing an inverted signal by inverting said data gate signal;
a third transistor having a gate coupled to receive said inverted signal, and a first channel connected to ground;
a fourth transistor having a gate coupled to receive said power supply source, and a first channel connected to a second channel of said third transistor; and
an output node formed at a junction of a second channel of said fourth transistor and a second channel of said second transistor, for providing said second voltage signal to said data bus.

* * * * *

UNITED STATES PATENT AND TRADEMARK OFFICE
CERTIFICATE OF CORRECTION

PATENT NO. : 5,204,839
DATED : 20 April 1993
INVENTOR(S) : Woong-Mu Lee

It is certified that error appears in the above-indentified patent and that said Letters Patent is hereby corrected as shown below:

Column 5,

Line 43,    change "voltage 20" to --voltage 203--;

Column 9,

Line 13,    change "voltage 20" to --voltage 201--;

Column 11,

Line 30,    change "give" to --given--; and

Column 15,

Line 5,    change "gate" to --data--.

Signed and Sealed this

Twenty-third Day of August, 1994

Attest:

BRUCE LEHMAN

*Attesting Officer*    *Commissioner of Patents and Trademarks*